United States Patent
Liu

(10) Patent No.: US 9,412,625 B2
(45) Date of Patent: Aug. 9, 2016

(54) MOLDED INSULATOR IN PACKAGE ASSEMBLY

(71) Applicant: INTEL CORPORATION, Santa Clara, CA (US)

(72) Inventor: Yueli Liu, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/799,516

(22) Filed: Jul. 14, 2015

(65) Prior Publication Data

US 2015/0318191 A1 Nov. 5, 2015

Related U.S. Application Data

(62) Division of application No. 13/684,145, filed on Nov. 21, 2012, now Pat. No. 9,113,573.

(51) Int. Cl.
| | |
|---|---|
| *H01L 21/44* | (2006.01) |
| *H01L 21/56* | (2006.01) |
| *H01L 23/00* | (2006.01) |
| *H01L 21/48* | (2006.01) |
| *H01L 21/311* | (2006.01) |
| *H05K 1/18* | (2006.01) |

(52) U.S. Cl.
CPC ............ *H01L 21/565* (2013.01); *H01L 21/311* (2013.01); *H01L 21/4803* (2013.01); *H01L 21/486* (2013.01); *H01L 21/4853* (2013.01); *H01L 24/03* (2013.01); *H01L 24/11* (2013.01); *H05K 1/185* (2013.01); *H01L 2224/03828* (2013.01); *H01L 2224/11849* (2013.01); *H05K 2201/0305* (2013.01); *H05K 2201/10674* (2013.01); *H05K 2203/1469* (2013.01)

(58) Field of Classification Search
USPC .................. 438/615, 629, 637, 668, 672, 675
See application file for complete search history.

(56) References Cited

U.S. PATENT DOCUMENTS

| | | | | |
|---|---|---|---|---|
| 5,111,278 | A | * | 5/1992 | Eichelberger ......... H01L 23/473 257/698 |
| 6,774,478 | B2 | | 8/2004 | Eto et al. |
| 8,039,939 | B2 | | 10/2011 | Hwang |
| 8,742,561 | B2 | | 6/2014 | Guzek |

OTHER PUBLICATIONS

Non-Final Office Action mailed Jul. 15, 2014, issued in corresponding U.S. Appl. No. 13/684,145, filed Nov. 21, 2012, 12 pages.
Final Office Action mailed Dec. 5, 2014, issued in corresponding U.S. Appl. No. 13/684,145, filed Nov. 21, 2012, 9 pages.
Notice of Allowance mailed Apr. 21, 2015, issued in corresponding U.S. Appl. No. 13/684,145, filed Nov. 21, 2012, 8 pages.

* cited by examiner

*Primary Examiner* — Timor Karimy
(74) *Attorney, Agent, or Firm* — Schwabe, Williamson & Wyatt, P.C.

(57) ABSTRACT

Embodiments of the present disclosure describe techniques and configurations for package assembly including an embedded element and a molded insulator material. In some embodiments, an apparatus includes an electrical element (such as a die or a bridge interconnect structure) positioned on a surface of an insulator layer, a conductive pad positioned on the surface of the insulator layer and spaced apart from the electrical element, and a molded insulator material disposed on the surface of the insulator layer adjacent to the electrical element and on the conductive pad. Other embodiments may be described and/or claimed.

9 Claims, 6 Drawing Sheets

MOLDED INSULATOR IN PACKAGE ASSEMBLY

RELATED APPLICATIONS

This application is a division of U.S. patent application Ser. No. 13/684,145, entitled "MOLDED INSULATOR IN PACKAGE ASSEMBLY," filed on Nov. 21, 2012, which is hereby incorporated by reference in its entirety for all purposes.

FIELD

Embodiments of the present disclosure generally relate to the field of integrated circuits, and more particularly, to techniques and configurations for a molded insulator in a package assembly.

BACKGROUND

Integrated circuit (IC) products may include embedded electrical elements, such as dies or bridge interconnect structures. Embedding these elements may involve drilling cavities for these elements into a substrate, and laminating an insulating material, such as a film, over the elements positioned in the cavities.

The reliability of such IC products may be adversely affected by high aspect ratio gaps between the embedded element and the walls of the cavity (even after lamination), damage to other components caused by drilling, and undulations in the surface of laminated layers caused by non-uniformities in the underlying structures. Cavity formation may also be prohibitively cost and time intensive for certain applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
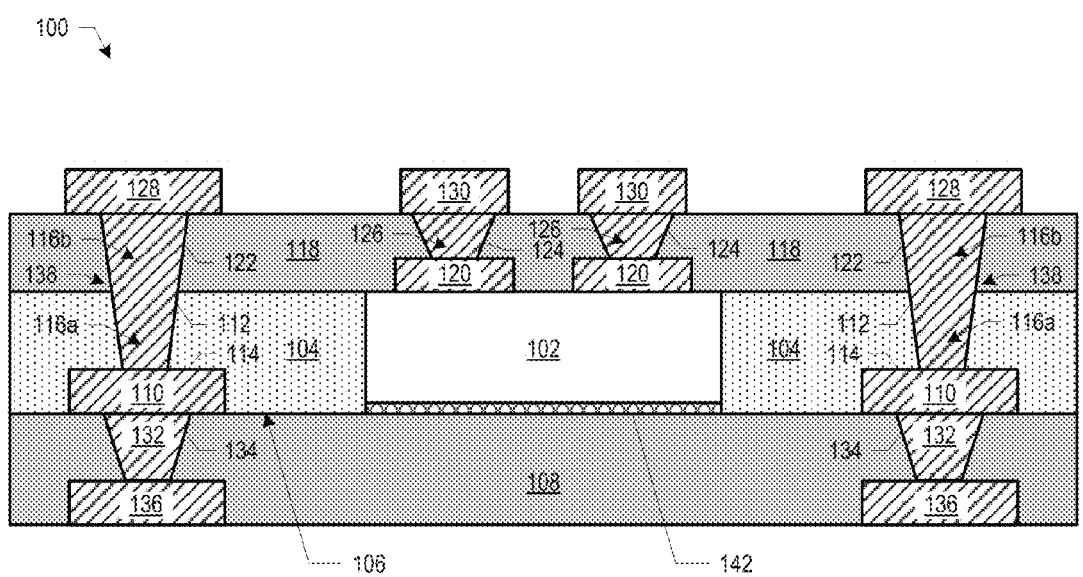
FIG. 1 schematically illustrates a cross-section side view of an example integrated circuit (IC) package assembly including an embedded electrical element and a molded insulator material, in accordance with some embodiments.

Embodiments of the present disclosure describe techniques and configurations for package assembly including an embedded electrical element and a molded insulator material. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 schematically illustrates a cross-section side view of a portion of an example integrated circuit (IC) package assembly 100. The portion of package assembly 100 illustrated in FIG. 1 may represent a portion of several layers of package assembly 100 (e.g., top or middle layers). Package assembly 100 may include an embedded electrical element 102 with a molded insulator material 104, in accordance with some embodiments. Embedded electrical element 102 may include one or more conductive pads 120 that may provide interconnect points for routing electrical signals to and from embedded die 102. In some embodiments, electrical element 102 may be a die. In some embodiments, embedded electrical element 102 may have one or more transistor devices formed thereon. Embedded electrical element 102 may represent a discrete chip. Embedded electrical element 102 may be, include, or be a part of a processor, memory, or application specific integrated circuit (ASIC), or a passive component such as a capacitor or a resistor.

In some embodiments, embedded electrical element 102 may be a bridge interconnect structure that provides a route for electrical signals (between, e.g., two or more dies in package assembly 100, not shown). A bridge interconnect structure may include a bridge substrate composed of glass or a semiconductor material (e.g., high resistivity silicon) having electrical routing features formed thereon to provide, e.g., a chip-to-chip connection between multiple dies. A bridge interconnect structure may be composed of other suitable materials in other embodiments. In some embodiments, a bridge interconnect structure may be configured to route input/output (I/O) signals and/or power or ground signals associated with the operation of one or more dies. In some embodiments, a bridge may be disposed between some dies in package assembly 100 and not between other dies.

Embedded electrical element 102 may be positioned on a surface 106 of a first insulator layer 108. In some embodiments, first insulator layer 108 is an epoxy-based laminate substrate having a core and/or build-up layers such as, for example, an Ajinomoto Build-up Film (ABF) substrate. First insulator layer 108 may include other suitable types of substrates in other embodiments. In some embodiments, a suitable adhesive (e.g., die attach adhesive) may be applied to surface 106 of first insulator layer 108, to a surface of embedded 102, or both, to couple embedded electrical element 102 to first insulator layer 108. For example, as shown in FIG. 1, a die backside film (DBF) layer 142 may be disposed between embedded electrical element 102 and surface 106 of first insulator layer 108 to enhance adhesion between embedded electrical element 102 and first insulator layer 108 or control the distance between embedded electrical element 102 and first insulator layer 108. In some embodiments, embedded electrical element 102 may be only partially embedded in package assembly 100.

Also positioned on surface 106 of the first insulator layer 108 may be one or more conductive pads or traces 110. As shown in FIG. 1, conductive pads 110 may be spaced apart from embedded electrical element 102 on surface 106. In some embodiments, conductive pads 110 may be in contact with conductive materials 132 disposed in corresponding vias 134 extending through first insulator layer 108 to corresponding conductive pads 136 embedded in first insulator layer 108. Conductive pads 136 may be in electrical contact with one or more additional electrical elements, such as one or more dies (not shown).

Molded insulator material 104 may be disposed on surface 106 of insulator layer 108 adjacent to embedded electrical element 102 and on conductive pads 110. In some embodiments, molded insulator material 104 may be a resin, an epoxy, or a plastic. In some embodiments, molded insulator material 104 may be a thermally molded insulator material. For example, molded insulator material 104 may be a fluid at elevated temperatures, and may harden to set when the temperature is reduced and molded insulator material 104 is allowed to cool. In some embodiments, a thickness of molded insulator material 104 (in a direction perpendicular to surface 106 of first insulator layer 108) is less than 30 microns. A top side of embedded electrical element 102 (e.g., with conductive pads 120) may not be covered by molded insulator material 104.

Vias 112 may extend through molded insulator material 104 to surfaces 114 of conductive pads 110. In some embodiments, vias 112 have a sloped profile (as shown in FIG. 1) consistent with being laser-drilled from molded insulator material 104. Conductive materials 116a may be disposed in vias 112, and may be in electrical contact with conductive pads 110 at surfaces 114. In some embodiments, conductive materials 116a may include solder balls that have been disposed in corresponding vias 112, heated and allowed to flow to substantially fill vias 112, as discussed in additional detail below with reference to FIGS. 2 and 3. In some embodiments, conductive solder bumps extend out of openings 138 of vias 112.

In some embodiments, a second insulator layer 118 may be disposed on molded insulator material 104. As shown in FIG. 1, second insulator layer 118 may also be disposed on embedded electrical element 102, including conductive pads 120. In some embodiments, second insulator layer 118 may be formed by laminating an insulating film, such as an Ajinomoto build-up film (ABF) to molded insulator material 104 and embedded electrical element 102. Vias 122 may extend through second insulator layer 118 to conductive materials 116a, and may include conductive materials 116b (which may be the same conductive materials as conductive materials 116a) disposed in vias 122.

In some embodiments, vias 124 may extend through second insulator layer 118 to conductive pads 120 of embedded electrical element 102, and conductive materials 126 may be disposed in vias 124. A conductive pad 128 may be disposed on or above conductive material 116b in via 122, and conductive pads 130 may be disposed on or above conductive materials 126 in vias 124. Electrical connections between embedded electrical element 102 and other components, such as conductive pads 128, may occur via conductive pads 130. For example, in some embodiments, an electrical interconnect (such as a silicon bridge) is configured to electrically connect embedded electrical element 102 with one or more of conductive pads 110, which are themselves in electrical contact with one or more corresponding dies (not shown).

In some embodiments, package assembly 100 may not include second insulator layer 118. In some such embodiments, one or more of conductive pads 120 and conductive materials 116a and 116b may provide interconnect points for routing electrical signals between components of package assembly 100. For example, conductive pads 120 may provide interconnect points for routing electrical signals between embedded electrical element 102 and another chip to provide, for example, a chip-to-chip connection between multiple dies.

Various aspects of the package assemblies disclosed herein (such as package assembly 100 of FIG. 1) may provide manufacturing and/or performance advantages over traditional IC packages. Molding materials have been traditionally limited to use in the encapsulation of complete IC packages or the separation of complete packages in a larger device. By disposing embedded electrical element 102 on surface 106 of insulator layer 108, then depositing molded insulator material 104 adjacent to embedded electrical element 102, no cavity need be drilled for embedded electrical element 102, thereby avoiding damage (e.g., cracking) that may be caused to sensitive and nearby components by such drilling as well as the additional time and expense typically required for drilling and other cavity formation techniques. Consequently, components may be positioned more closely to embedded electrical element 102 with a lower risk of damage during manufacturing, and thus a finer pitch may be achieved. For example, in some embodiments, conductive pads 110 may be spaced apart from embedded electrical element 102 along surface 106 by 75 microns or less. Additionally, the manufacturing tolerance typically required for the dimensions of the cavity requires tight control of manufacturing equipment and may result in a high aspect ratio gap between the wall of the cavity and the electrical element disposed therein, which may be difficult to fill with traditional insulating films.

The use of molded insulator material 104, instead of a traditional insulating film, may allow better general conformance between molded insulator material 104 and embedded electrical element 102, and between molded insulated material 104 and conductive pads 110. In particular, a liquid molded insulator material 104 may flow to closely match the dimensions of the underlying assembly before setting in place, thereby providing more mechanical support to the assembly and reducing the potential for the underlying components to dislocate or delaminate. Thus, the package assembly 100 and related techniques described herein may allow the use of more irregularly shaped electrical elements (e.g., dies with curved or otherwise irregular profiles) in package assemblies than traditional techniques. Molded insulator material 104 may also provide a more uniform top surface 144 on which additional layers may be formed than traditional insulating films (which may undulate due to the heterogeneity of the underlying package structure).

FIGS. 2A-2G schematically illustrate a package assembly 200 including an embedded electrical element 202 and a molded insulator material 204 subsequent to various fabrication operations, in accordance with some embodiments. Package assembly 200 may comport with embodiments described in connection with FIG. 1.

Figure 2A:
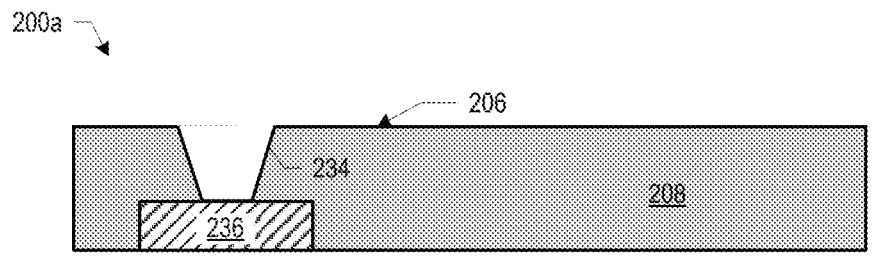
FIGS. 2A-2G schematically illustrate a package assembly including an embedded electrical element and a molded insulator material subsequent to various fabrication operations, in accordance with some embodiments.

Referring to FIG. 2A, a package assembly 200a is depicted subsequent to forming an insulator layer 208 on and around a conductive pad 236 and forming a via 234 in a surface 206 of insulator layer 208. As shown in FIG. 2A, via 234 may extend from surface 206 to conductive pad 236. In some embodiments, insulator 208 may be formed by laminating an insulating film (such as an ABF) onto previously assembled layers of a package assembly (including conductive pad 236).

Figure 2B:
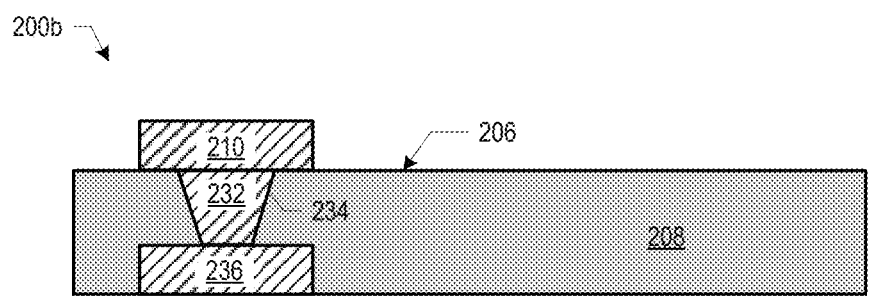

Referring to FIG. 2B, a package assembly 200b is depicted subsequent to depositing a conductive material 232 in via 234 and forming a conductive pad 210 on surface 206 of insulator layer 208. In some embodiments, conductive material 232 and conductive pad 210 may be formed on package assembly 200b as part of a single, substantially unitary manufacturing operation. Conductive pad 210 may be in electrical contact with conductive material 232 deposited in via 234. In some embodiments, conductive pad 210 may be formed by copper plating a portion of surface 206 of insulator layer 208. In some embodiments, a dry film resist (DFR) technique may be used in forming conductive pad 210. In some embodiments, surface 206 is roughened after conductive pad 210 is formed.

Figure 2C:
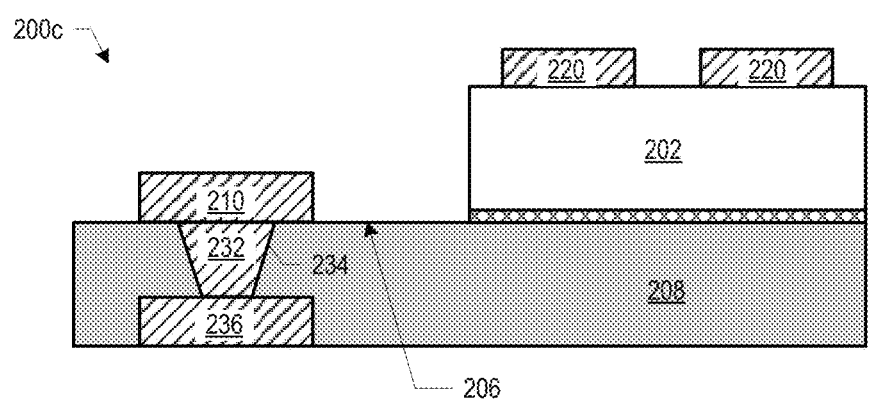

Referring to FIG. 2C, a package assembly 200c is depicted subsequent to coupling an electrical element 202 with surface 206 of insulator layer 208. As shown in FIG. C, electrical element 202 may be spaced away from conductive pad 210. Electrical element 202 may include one or more conductive pads 220, as shown.

Figure 2D:
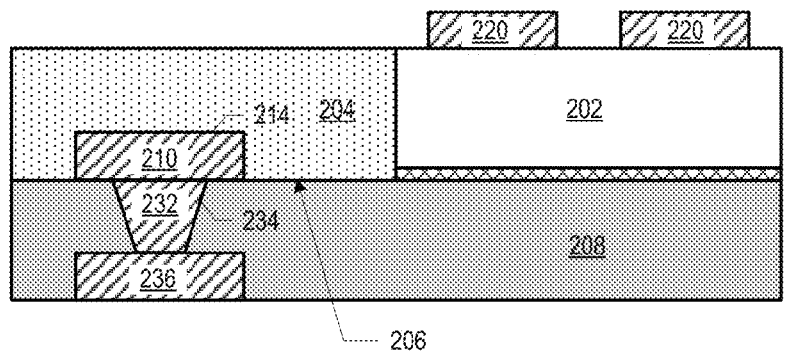

Referring to FIG. 2D, a package assembly 200d is depicted subsequent to depositing a molding insulator material 204 on surface 206 of insulator layer 208. Molding insulator material 204 may be deposited adjacent to electrical element 202 and on a surface 214 of conductive pad 210. After depositing molding insulator material 204, molding insulator material 204 may be allowed to set. For example, in some embodiments, depositing molding insulator material 204 is part of a thermal process that elevates a temperature of molding insulator material 204 to provide a fluid molding insulator material, depositing the fluid molding insulator material adjacent to electrical element 202 and on surface 214 of conductive pad 210, and allowing the fluid molding insulator material to cool and harden.

Figure 2E:
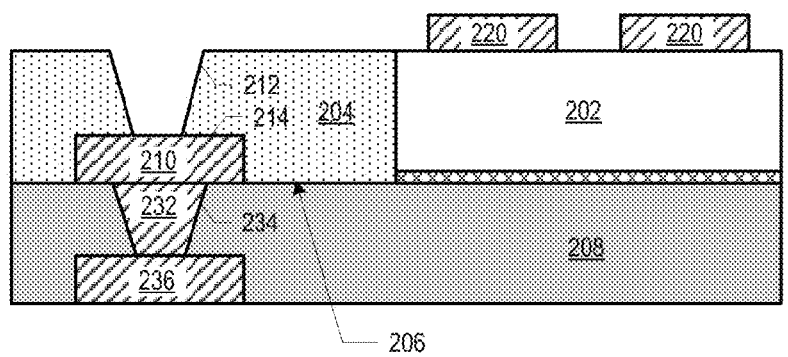

Referring to FIG. 2E, a package assembly 200e is depicted subsequent to forming a via 212 through molding insulator material 204 (e.g., in some embodiments, after molding insulator material has been allowed to set). In some embodiments, via 212 is formed by laser drilling. As shown in FIG. 2E, via 212 may extend through molding insulator material 204 to surface 214 of conductive pad 210.

Figure 2F:
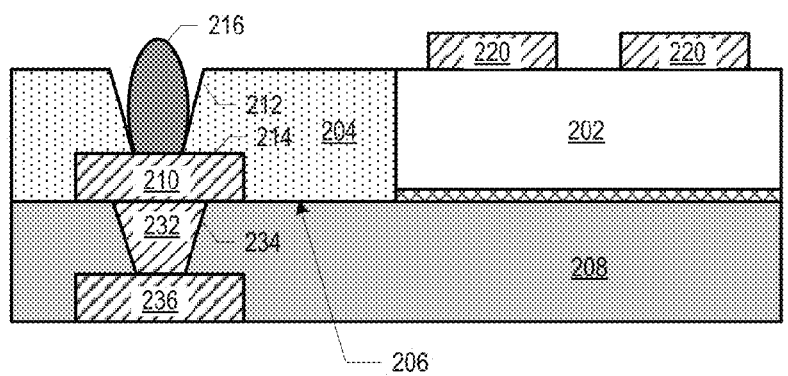

Referring to FIG. 2F, a package assembly 200f is depicted subsequent to depositing a conductive material 216 in via 212. In some embodiments, as shown in FIG. 2F, conductive material 216 may include a solder ball. In some such embodiments, depositing conductive material 216 in via 212 may include applying flux within the via 212 and placing a solder ball in via 212.

Figure 2G:
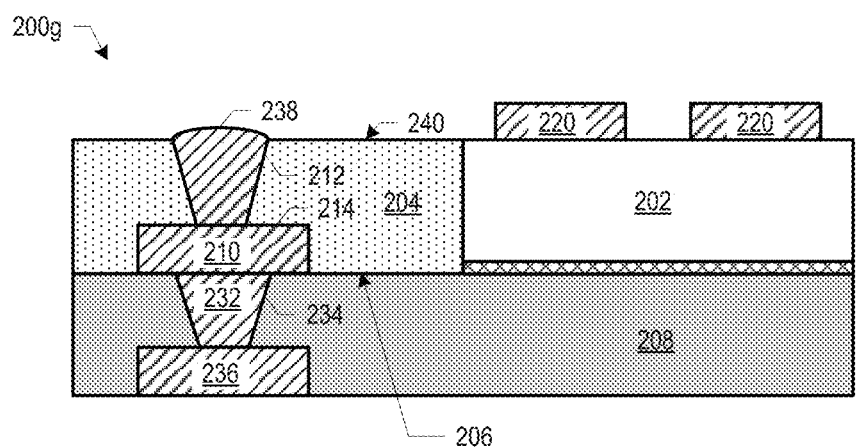

Referring to FIG. 2G, a package assembly 200g is depicted subsequent to melting conductive material 216 (e.g., a solder ball) to form a bump 238 that extends above a surface 240 of insulator material 204. Surfaces of package assembly 200h may also be defluxed. Additional layers may then be formed on top of package assembly 200g, with electrical connections made to conductive pad 210 via bump 238 and to electrical element 202 via conductive pads 220 (e.g., as shown in FIG. 1). In some embodiments, as shown in FIG. 2G, bump 238 may be formed with approximately the same height as conductive pads 220, and both may provide interconnect points for routing electrical signals to and from embedded element 202 directly to one or more other chips. In some embodiments, one or more additional layers (such as an additional insulator layer, not shown) may be formed on top of package assembly 200g.

Figure 3:
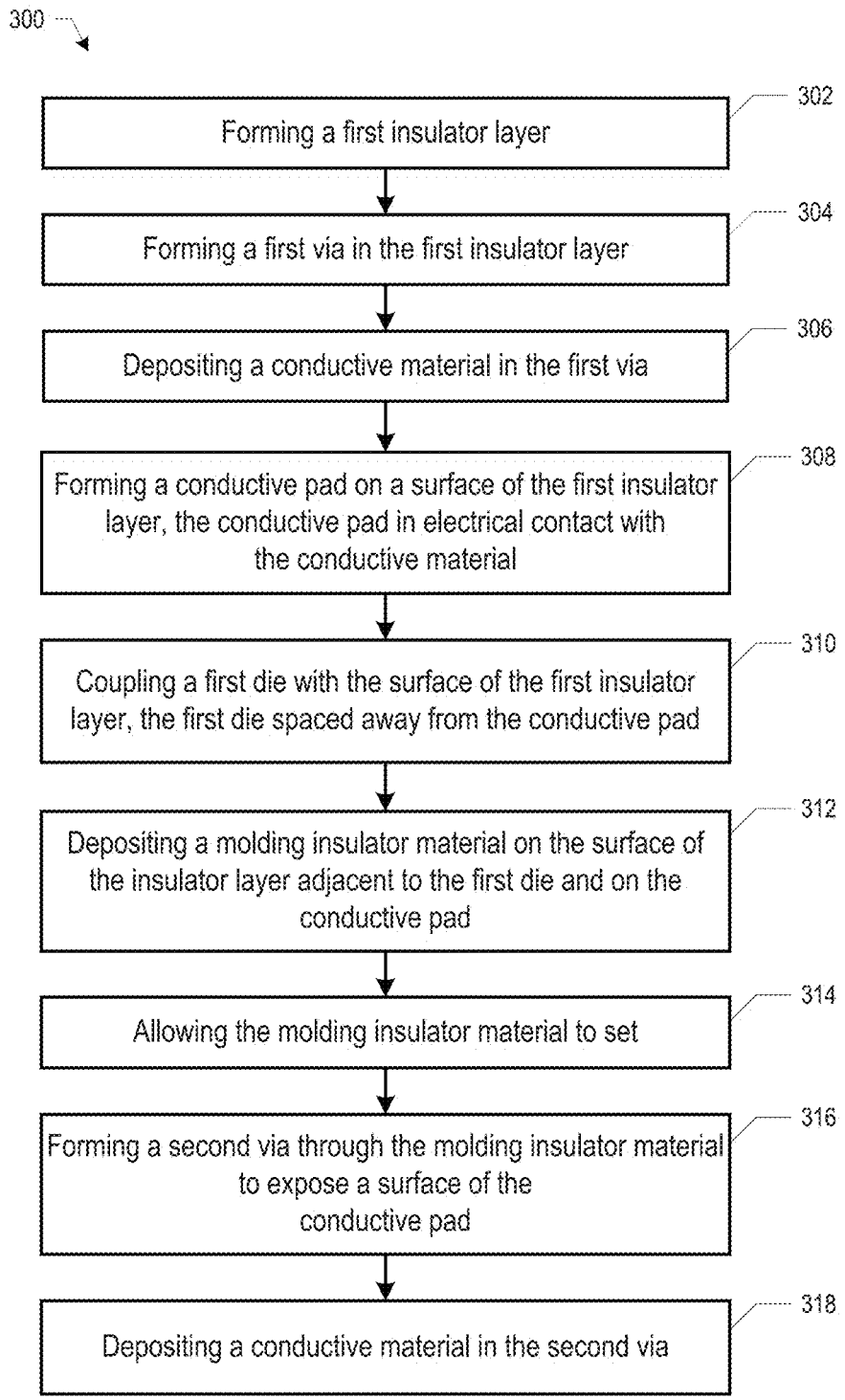
FIG. 3 schematically illustrates a flow diagram of a method of fabricating a package assembly including an embedded electrical element and a molded insulator material, in accordance with some embodiments.

FIG. 3 schematically illustrates a flow diagram 300 for a method of fabricating a package assembly (e.g., the IC package assembly 100 of FIG. 1), in accordance with some embodiments. The method of flow diagram 300 may comport with actions described in connection with FIGS. 1-2, in some embodiments.

At 302, the method may include forming a first insulator layer. In some embodiments, 302 may include laminating an insulating film (e.g., on an existing IC substrate). At 304, the method may include forming a first via in the first insulator layer. At 306, the method includes depositing a conductive material in the first via. At 308, the method may include forming a conductive pad on a surface of the first insulator layer, the conductive pad in electrical contact with the conductive material deposited in the first via. In some embodiments, 306 and 308 may be performed as part of a substantially unitary manufacturing operation. At 310, the method may include coupling a first electrical element with the surface of the first insulator layer. The first electrical element may be spaced away from the conductive pad. The electrical element may include a die or a bridge interconnect structure.

At 312, the method may include depositing a molding insulator material on the surface of the insulator layer adjacent to the first electrical element (coupled to the surface of the first insulator layer at 310) and on the conductive pad (formed on the surface of the first insulator layer at 308). At 314, the method may include allowing the molding insulator material to set. In embodiments in which depositing the molding insulator material at 312 is part of a thermal process (as described above with reference to FIG. 2), allowing the molding insulator material to set at 314 may include allowing a fluid molding material to cool and harden. At 316, the method may include forming a second via through the molding insulator material to expose a surface of the conductive pad. In some embodiments, 316 may include laser drilling the second via from the molding insulator material. At 316, the method may include depositing a conductive material in the second via. In some embodiments, 316 may include applying flux within the second via, placing a solder ball in the second via, and melting the solder ball to form a bump that extends above the surface of the insulator material.

Figure 4:
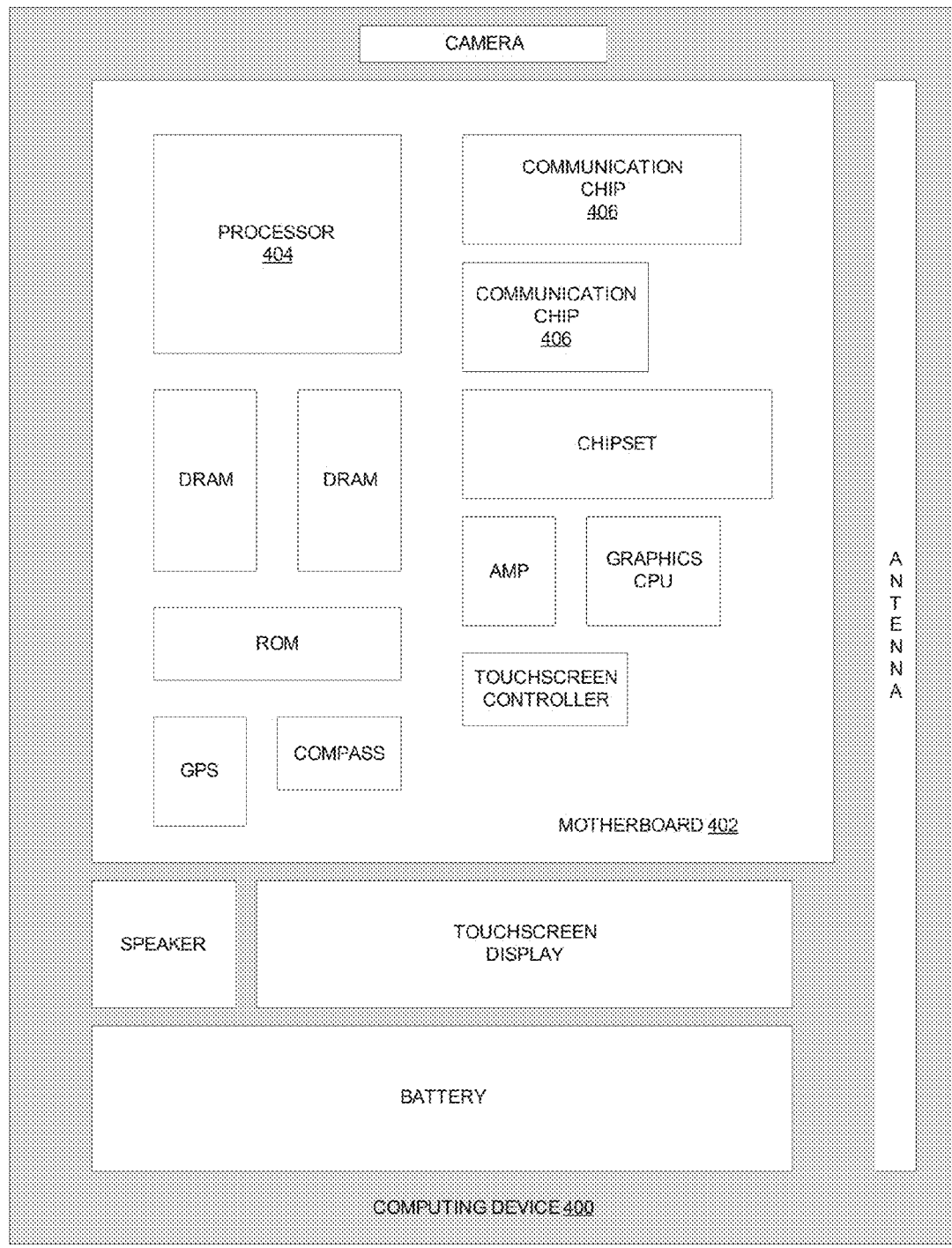
FIG. 4 schematically illustrates a computing device, in accordance with some embodiments.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 4 schematically illustrates a computing device 400 in accordance with some implementations. The computing device 400 may house a board such as motherboard 402. The motherboard 402 may include a number of components, including but not limited to a processor 404 and at least one communication chip 406. The processor 404 may be physically and electrically coupled to the motherboard 402. In some implementations, the at least one communication chip 406 may also be physically and electrically coupled to the motherboard 402. In further implementations, the communication chip 406 may be part of the processor 404.

Depending on its applications, computing device 400 may include other components that may or may not be physically and electrically coupled to the motherboard 402. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16—2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other embodiments.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 may include a die (e.g., included in electrical element 102 of FIG. 1) in an IC package assembly (e.g., IC package assembly 100 of FIG. 1) as described herein. The term "processor" may refer to any device or portion of a device that processes electronic data from registers and/or memory to transform that electronic data into other electronic data that may be stored in registers and/or memory.

The communication chip 406 may also include a die (e.g., included in electrical element 102 of FIG. 1) in an IC package assembly (e.g., IC package assembly 100 of FIG. 1) as described herein. In further implementations, another component (e.g., memory device or other integrated circuit device) housed within the computing device 400 may contain a die (e.g., included in electrical element 102 of FIG. 1) in an IC package assembly (e.g., IC package assembly 100 of FIG. 1) as described herein. Such dies may be configured to send or receive signals through a bridge interconnect structure as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data. In some embodiments, the package assemblies and techniques described herein are implemented in a high-performance computing device. In some embodiments, the package assemblies and techniques described herein are implemented in handheld computing devices.

The above description of illustrated implementations, including what is described in the Abstract, is not intended to be exhaustive or to limit the disclosure to the precise forms disclosed. While specific implementations are described herein for illustrative purposes, various equivalent modifications are possible within the scope of the disclosure, as those skilled in the relevant art will recognize.

These modifications may be made to the disclosed embodiments in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A method, comprising:
   forming a first via in a first insulator layer,
   depositing a conductive material in the first via;
   forming a conductive pad on a surface of the first insulator layer, the conductive pad in electrical contact with the conductive material deposited in the first via;
   physically coupling an electrical element with the surface of the first insulator layer, the electrical element spaced away from the conductive pad and comprising a die or a bridge interconnect structure;
   depositing a molding insulator material on the surface of the insulator layer adjacent to the electrical element and on the conductive pad such that the molding insulator material is in contact with the first insulator layer and the conductive pad; and
   forming a second via through the molding insulator material to expose a surface of the conductive pad.

2. The method of claim 1, further comprising:
   after depositing the molding insulator material, allowing the molding insulator material to set; and
   depositing a conductive material in the second via.

3. The method of claim 2, wherein forming the second via is performed by laser drilling.

4. The method of claim 2 wherein:
   depositing a molding insulator material is part of a thermal process that elevates a temperature of the molding insulator material to provide a fluid molding insulator material; and
   allowing the molding insulator material to set comprises allowing the fluid molding insulator material to cool and harden.

5. The method of claim 2, wherein depositing a conductive material in the second via comprises:
   applying flux within the second via;
   placing a solder ball in the second via; and
   melting the solder ball to form a bump that extends above the surface of the molded insulator material.

6. The method of claim 1, further comprising:
   forming the first insulator layer by laminating an insulating film.

7. The method of claim 1, wherein physically coupling an electrical element with the surface of the first insulator layer includes directly physically coupling the electrical element with the surface of the first insulator layer.

8. The method of claim 1, wherein physically coupling the electrical element with the surface of the first insulator layer . . . includes directly physically coupling . . . the electrical element with a first side of a die backside film (DBF) layer and directly physically coupling a second side of the DBF layer, which is opposite the first side, with the surface of the first insulator layer.

9. The method of claim 1, wherein physically coupling the electrical element with the surface of the first insulator layer include physically coupling the electrical element with the surface of the first insulator layer such that there is no molding insulator material between the electrical element and the surface of the first insulator layer.

* * * * *